United States Patent [19]

Schrantz et al.

[11] Patent Number: 5,552,345
[45] Date of Patent: Sep. 3, 1996

[54] DIE SEPARATION METHOD FOR SILICON ON DIAMOND CIRCUIT STRUCTURES

[75] Inventors: Gregory A. Schrantz; Stephen J. Gaul; Jack H. Linn, all of Melbourne, Fla.

[73] Assignee: Harris Corporation, Melbourne, Fla.

[21] Appl. No.: 125,411

[22] Filed: Sep. 22, 1993

[51] Int. Cl.$^6$ ................................. H01L 21/302
[52] U.S. Cl. .......................... 437/227; 437/226
[58] Field of Search ..................... 437/226, 227; 148/DIG. 28; 117/929

[56] References Cited

U.S. PATENT DOCUMENTS

| | | | |
|---|---|---|---|
| 4,355,457 | 10/1982 | Barlett et al. | 437/226 |
| 4,610,079 | 9/1986 | Abe et al. | 148/DIG. 28 |
| 5,091,331 | 2/1992 | Delgado et al. | 437/227 |
| 5,302,554 | 4/1994 | Kashiwa et al. | 437/226 |

OTHER PUBLICATIONS

Chemical Vapor Depositions of Diamond for Electronic Packaging Applications, by David J. Pickrell and David S. Hoover, Allentown, PA, Jun. 16–20, 1991, pp. 397–412 of Proceedings—First Int'l High Temperature Electronics Conference.

Excimer–Laser Etching of Diamond and Hard Carbon Films by Direct Writing and Optical Protection[a], by M. Rothschild, C.Arnone,[b] and D. J. Ehrlich, Lexington, Mass., Sep. 13, 1985, pp. 310–314.

Excimer vs Nd:Yag Laser Machining of Silicon Vias for 3D Interconnects, by Rex A. Lee and Wilfrido Moreno, Tampa, FL, pp. 55–58, May 1992.

Excimer vs Nd:Yag Laser Creation of Silicon Vias for 3D Interconnects, by Rex A. Lee and Wilfrido A. Tampa, FL, pp. 358–360 of Int'l Electronics Manufacturing Technology Symposium, 1992.

Selective Deposition on Diamond Films, by J. L. Davidson, C. Ellis and R. Ramesham, Journal of Electronic Materials, vol. 18, No. 6, 1989, pp. 711–715.

*Primary Examiner*—R. Bruce Breneman
*Assistant Examiner*—Ramamohan Rao Paladugu
*Attorney, Agent, or Firm*—Nixon, Hargrave, Devans & Doyle

[57] ABSTRACT

Silicon on diamond die 5 are separated by patterning the diamond layer 3 and sawing the silicon layer 4. The diamond layer 3 is patterned by known techniques including laser ablation or using a silicon dioxide mask to resist deposition of diamond material. Patterning may take place after formation of microelectronic devices in dies in the silicon layer, after a device water is bonded to a diamond layer but before formation of the devices, prior to joining the device wafer to the diamond layer.

75 Claims, 8 Drawing Sheets

DIE SEPARATION METHOD FOR SILICON ON DIAMOND CIRCUIT STRUCTURES

BACKGROUND

This invention relates in general to silicon on diamond circuits, and in particular, to a method for separating dies of silicon on diamond.

Diamond has valuable thermal and electrical properties which are highly desirable in microelectronic circuits. Diamond has the highest thermal conductivity of any known material. At room temperature, diamond is about five times as thermally conductive as copper. Diamond is also an excellent electrical insulator and has a superior dielectric strength. As such, diamond makes an excellent material for heat sinks in microelectronic circuits. The ability of diamond to insulate the circuit and rapidly remove heat from the circuit increases the overall performance of microelectronic circuits because their speed deteriorates with heat. Moreover, heat also contributes to the early failure of microelectronic circuits.

Until recently diamond has not been a useful material due to the difficulty of integrating it into existing circuit fabrication techniques. However, recent advances have enabled those skilled in the art to deposit layers of diamond using chemical vapor deposition techniques. One such technique is described in "Chemical Vapor Deposition of Diamond for Electronic Packaging Applications," David J. Pickerel and David S. Hoover, Proceedings, First International High Temperature Electronics Conference, Jun. 16–20, 1991.

Another well-known property of diamond is its hardness. This property renders it difficult to separate the dies of wafers having diamond layers. In a typical die separation process, a circular saw having a diamond-coated blade is used to remove silicon from the area between dies. This operation is normally carried out on a wafer dicing machine. The wafer is affixed to an adhesive surface of a film material that is mounted on a frame. The frame and wafer are placed beneath the saw and the saw cuts through the wafer and partially into the membrane of the film. Thereafter, the die are removed from the film with a pick and place machine that mounts the die into a chip carrier or other package.

However, such traditional methods of die separation are unsatisfactory for wafers with diamond layers. Due to the hardness of diamond, circular diamond saw blades are rapidly worn out. Thus, those skilled in the art have resorted to a scribe and break method for separating die. Using that method, a saw partially penetrates the diamond layer. Thereafter, the die are separated along the scribe marks in the diamond layer by mechanically snapping the layer over a surface disposed beneath the partial scribe line. This method is akin to the method used to cut glass with a scriber. The problem with such method is that it often applies mechanical stresses across the wafer so that the risk of damage to the electronic circuits on the die is high.

In view of the above problems, it would be desirable to have a reliable method for separating silicon on diamond dies.

SUMMARY

The invention includes a method that applies manufacturing processes which are well characterized in order to separate die from the wafer. In its more general aspects, the invention provides for patterning a layer of diamond material on a support or sacrificial layer of a wafer. The diamond material is patterned into a pattern corresponding to the scribe lines of the final wafer. Thereafter, the silicon on diamond devices may be separated from the wafer by following the scribe pattern made in the diamond layer.

More specifically, the invention includes one embodiment for providing a patterned diamond layer. This embodiment includes a process having a first step of laser machining or reactive ion etching of a silicon layer that carries the diamond layer. The silicon is ablated or reactive ion etched to have a pattern of scribe lines therein. So, portions of the diamond layer in the form of a scribe pattern are exposed by the ablation or reactive ion etching process. The exposed diamond layer is removed by a beam of high energy, such as a laser or by reactive ion etching. In the preferred embodiment, the exposed diamond layer is exposed to a laser beam of frequency doubled Nd:YAG laser radiation. Having thus removed the diamond layer from the scribe lines, the device wafer carrying the active microelectronic die may be sawed using a traditional diamond wafering saw that follows the scribe line pattern formed by the laser ablation or reactive ion etching.

In another embodiment of the invention, the diamond layer is ablated by a laser following the deposition of the diamond layer on its sacrificial substrate and prior to joining a device wafer to the substrate carrying the diamond layer. In this embodiment it is also possible to remove portions of the diamond layer using reactive ion etching (see SE-932, Ser. No. 08/042,299, filed Apr. 2, 1993, assigned to the same assignee as this application mid incorporated herein by reference), or ion beam etching (see Rothschild, et al., J. Vac. Sci. Technol. B 4 (1), Jan/Feb 1986).

A still further embodiment of the invention relies upon selective deposition of the diamond layer onto areas of a sacrificial layer that are patterned with a diamond resist layer. For example, it is known that diamond does not readily deposit on silicon dioxide. Hence, a sacrificial silicon wafer with a silicon dioxide scribe pattern on its surface will resist the deposition of diamond onto the silicon dioxide and allow the diamond to be deposited on the other areas of the wafer.

As described in the following embodiments, the invention may be practiced at various stages of formation of microelectronic devices. So, the diamond layer may be formed and scribed or patterned on a substrate before the diamond layer is joined to a device wafer. As an alternative, the diamond layer may be scribed or patterned after it is joined to a device wafer but before any devices are formed. A further alternative is to scribe the diamond layer after complete formation of the microelectronic devices.

BRIEF DESCRIPTION OF THE DRAWINGS

FIGS. 1a.1–e.1 are a series of partial schematic figures illustrating two embodiments of the invention where diamond removal and scribing is accomplished after joining the device wafer to a diamond film but before formation of the microelectronic devices.

DETAILED DESCRIPTION

With reference to FIG. 1, those skilled in the art will appreciate that there are numerous steps in fabrication of microelectronic circuits on diamond insulating layers. As such, the steps depicted in FIGS. 1a–c are shown for purposes of illustrating the invention and not for describing the detailed manufacturing processes which will be discussed later. As such, the figures vary from the actual sequence of manufacturing events. For example, the devices 5 shown in FIG. 1 may not be formed until after the sacrificial or handle layer 2 is fully removed. Hence, FIG. 1 is given for purposes of highlighting the particular steps of the invention and is not be deemed a full description of a silicon on diamond process.

Figure 1A:
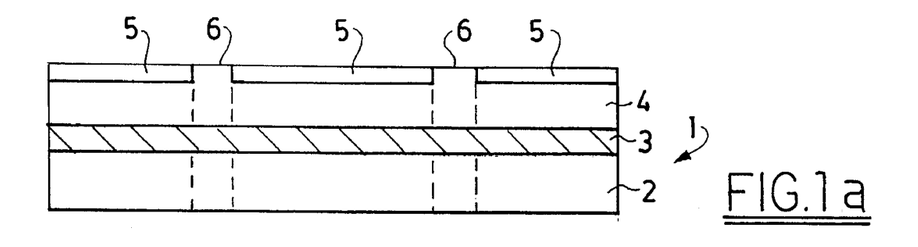
FIGS. 1a–c are a series of partial schematic figures illustrating diamond removal and scribing after formation of the microelectronic devices.
Figure 1B:
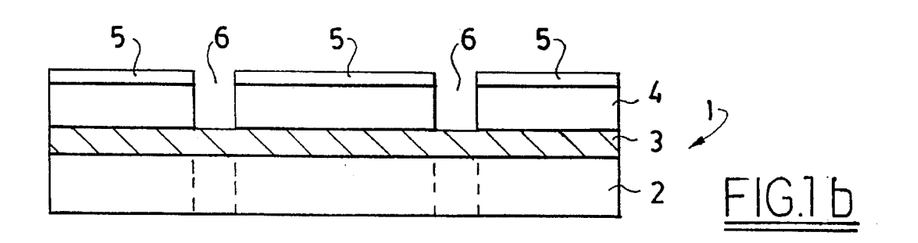
Figure 1B:
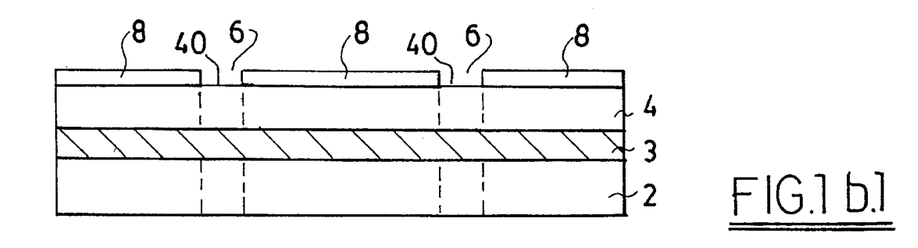
Figure 1C:
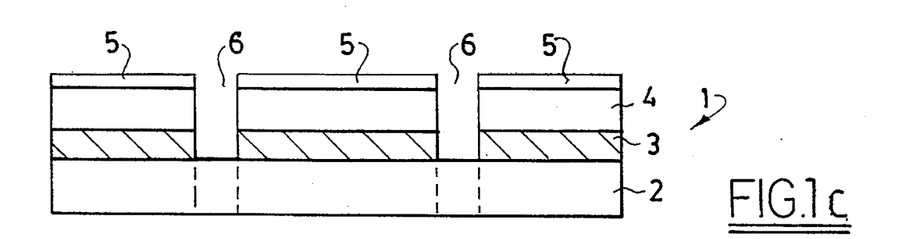
Figure 1C:
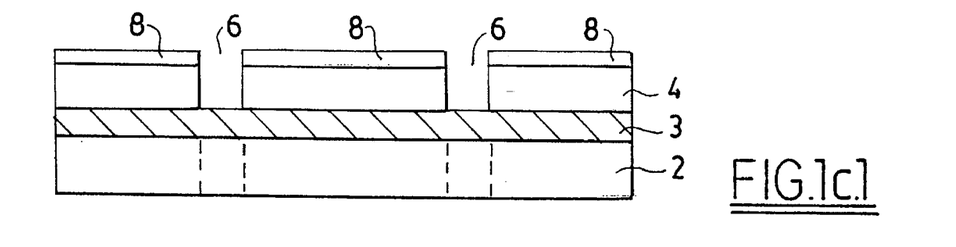

In FIG. 1a, a composite wafer 1 has a handle or sacrificial wafer 2, a diamond layer 3 and a device wafer 4. The diamond layer 3 has been previously deposited on the sacrificial wafer 2 by methods well known in the art. Likewise, the device wafer 4 bonded to the diamond layer 3, and microelectronic circuits 5 have been formulated within a layer or layers on one surface of device wafer 4 in a manner well known to those skilled in the art. Details about oxide bonding can be found in SE 898/900, Ser. No. 921,197, filed Jul. 28, 1992 assigned to the same assignee as this application and incorporated herein by reference. The devices 5 are separated from each other by a plurality of device-free areas 6 known as streets or scribe lines. In a normal die separation process, a circular saw would remove silicon from the streets 6 and thereby separate the die. However, with the diamond layer 3 disposed on the back surface of the device wafer 4, alternate techniques including those in the invention are needed to separate the die. As a first step, portions of device wafer 4 bounded within device-free region 6, are removed by laser machining to expose portions of diamond layer 3 thereunder, as shown in FIG. 1b. For the case where device wafer 4 is silicon, laser machining may be accomplished using a 248 nm KrF excimer laser. Next, as shown in FIG. 1c, the surface of wafer 4 with exposed streets 6 is exposed to a laser or reactive ion etch (RIE). The laser or reactive ion etch ( for RIE using oxygen, see for example SE-932, Ser. No. 42,299, filed Apr. 2, 1992, assigned to the same assignee as this application and incorporated herein by reference) removes the diamond from the areas defined by the scribe line 6.

In the preferred embodiment, a beam of high energy is used to remove the diamond layer 3. This beam can be a laser, in particular a Nd:YAG laser, more particularly, a frequency doubled Nd:YAG laser, or a 193 nm ArF excimer laser.

After the portions of diamond layer 3 are suitably removed, as shown in FIG. 1c, the sacrificial wafer 2 may be removed to separate wafer 4 into individual silicon dies 5, suitable for packaging. Alternatively, after portions of diamond layer 3 are suitably removed, as shown in FIG. 1c, the sacrificial wafer 2 may be sawn with a circular diamond saw blade through scribe street 6 to thereby separate wafer 4 into individual silicon on diamond dies 5 suitable for packaging.

In another embodiment, described in FIGS. 1a.1–1e.1, formation of scribe areas 6 may precede formation of microelectronic circuits in regions 5. In FIG. 1a.1, a composite wafer 1 has a handle or sacrificial wafer 2, a diamond layer 3, and a device wafer 4. The diamond layer 3 has been previously deposited on the device wafer 4 by methods well known in the art. Likewise, a handle wafer 2 has been bonded to the diamond layer 3 in a manner well known by those skilled in the art. As a first step, device wafer 4 is masked by suitable means with silicon dioxide or silicon nitride or a combination thereof, to define the pattern where street areas 6 will be formed. Portions of masking layer 8 are removed by suitable etching means, such as RIE, to expose surface 40 of device wafer 4, FIG. 1b.1. Next, as shown in FIG. 1c.1, street regions 6 of device wafer 4 are removed by RIE to expose portions of diamond layer 3. Street areas 6 of exposed diamond layer 3 may then be removed as previously described by laser ablation or RIE (for example with oxygen), FIG. 1d.1. Microelectronic circuits 5 may then be formed within a layer or layers of device wafer 4. The completed structure is shown in FIG. 1e.1. The handle or sacrificial wafer 2 may optionally be removed prior to die separation (not shown).

Figure 1D:
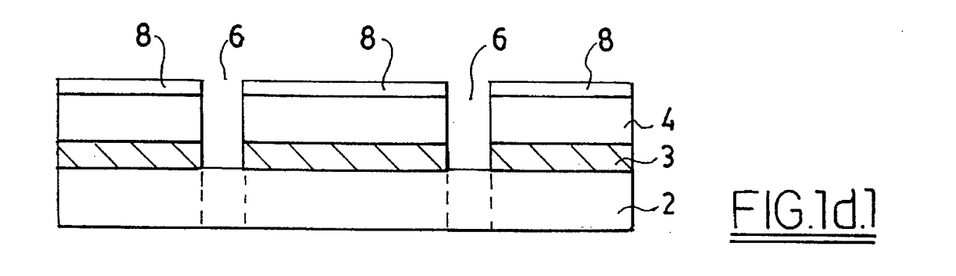
Figure 1E:
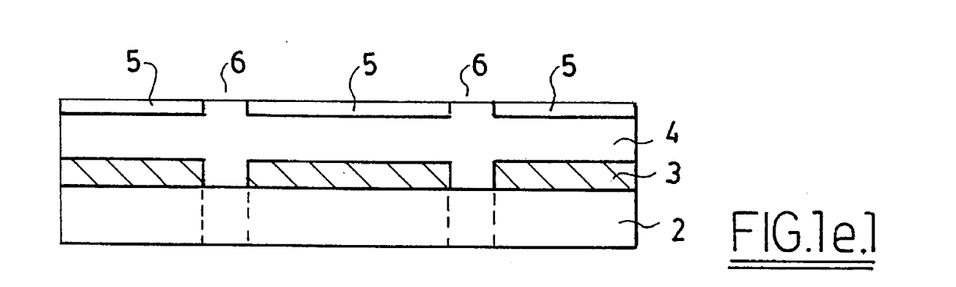

Those skilled in the art will understand that there are numerous steps in the fabrication process between the embodiment shown in FIG. 1d.1 and FIG. 1e.1. In further processing of the wafer 2 shown in FIG. 1d.1 the scribe streets 6 may be left void or filled with a suitable material. The decision to leave a void or fill the street 6 will depend upon the particular subsequent steps of the chosen process. Voids may remain so long as the diamond layer is not exposed to an oxidizing process. If the layer would be exposed to an oxidizing process, then the voids are filled with a suitable oxidation barrier material to prevent oxidation of the diamond layer 3. Such materials include a layer of silicon nitride which prevents the oxidation of the diamond layer 3. Other materials include polysilicon either alone or in combination with a silicon nitride layer.

Figure 2A:
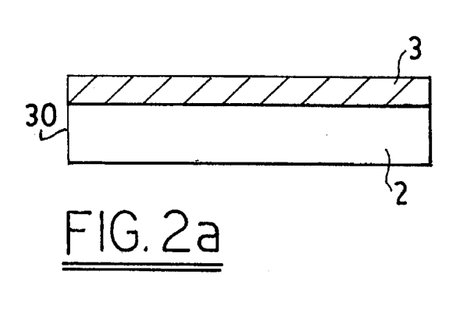
FIGS. 2a–c are a series of partial schematic figures illustrating diamond removal and scribing before joining a device wafer to a diamond film.
Figure 2B:
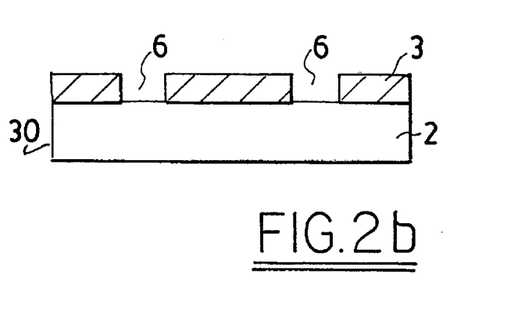
Figure 2C:
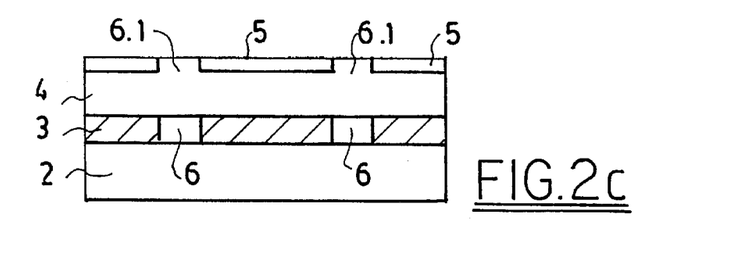

Turning to FIG. 2, an alternate embodiment of the invention is shown. In FIG. 2a, a diamond layer 3 is mounted on a sacrificial silicon substrate 2. Prior to joining a device wafer 4 to the substrate 30, comprising diamond layer 3 and substrate 2, the diamond layer 3 is patterned and portions of it are selectively removed in order to define a series of scribe lines 6 as shown in FIG. 2(b). As mentioned above, the diamond layer 3 may be removed by a suitable laser or by reactive ion etching or by ion beam etching. Thereafter, a device wafer 4 is joined to the diamond layer 3. As shown in FIG. 2c, microelectronic circuits 5 are subsequently formed within a layer or layers of device wafer 4. A pattern of scribe streets 6.1 disposed between microelectronic circuits 5 correspond to the pattern of scribe streets 6 within diamond layer 3.

Figure 3A:
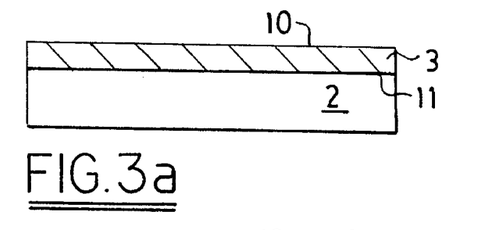
FIGS. 3a–k are a more detailed series of partial schematic views illustrating diamond removal and scribing before joining a device wafer to a diamond film.
Figure 3B:
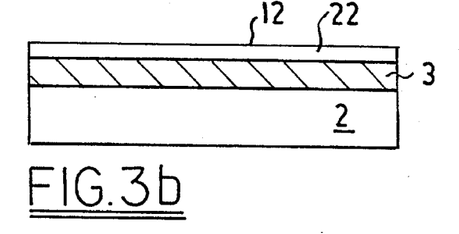
Figure 3C:
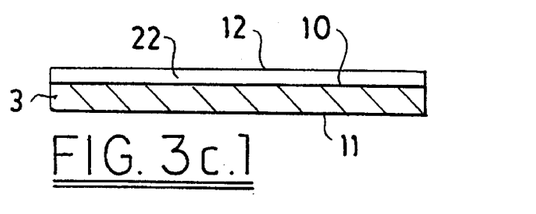
Figure 3C:
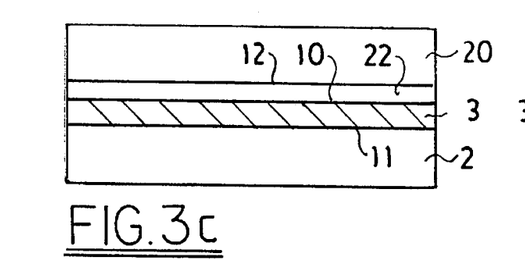
Figure 3D:
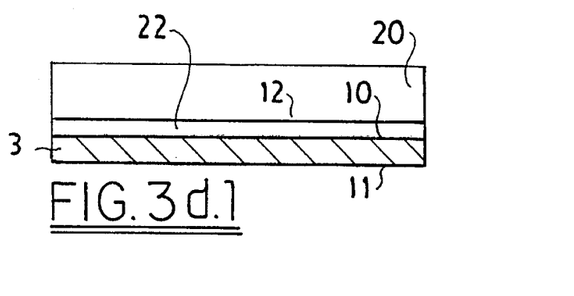

Turning to FIGS. 3a–k, there is shown a more detailed process flow of a typical silicon on diamond manufacturing process that is adapted to include the invention. As shown in FIG. 3a, a sacrificial substrate 2 has a diamond film 3 deposited on an upper surface 11. The upper surface of the diamond film 10 is then deposited with polysilicon bonding layer 22, as shown in FIG. 3(b). The polysilicon bonding layer 22 is then planarized. It is approximately one to two microns in thickness. Next, a silicon handle wafer 20 is bonded to the planarized surface 12 of polysilicon layer 22 as shown in FIG. 3(c). The handle 20 is attached to the polysilicon layer 22 using an oxide bond process. Additional details about oxide bonding can be found in SE-898/900, Ser. No. 921,197, filed Jul. 28,1992, assigned to the same assignee as this application and incorporated herein by reference. As an alternative, the bond may be a silicide bond, i.e. the polysilicon layer 22 and the silicon handle wafer 20 may be bonded by reacting the layers in a silicide process to form, for example, tungsten disilicide. Further details about this type of bonding can be found in SE-906, Ser. No. 939,786, filed Sep. 3, 1992, assigned to the same assignee as this application and incorporated herein by reference.

Figure 3D:
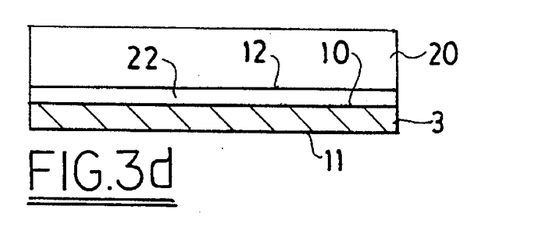
Figure 3E:
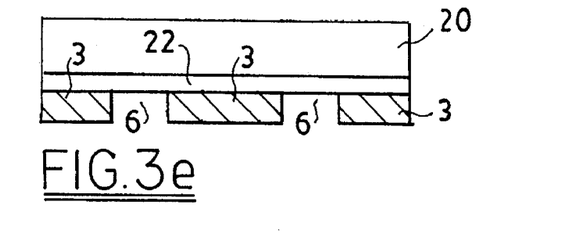

Once the handle wafer 20 is suitably bonded, the sacrificial substrate 2 may be removed by any suitable means, usually chemical etching. The surface 11 of diamond layer 3 is now exposed as shown in FIG. 3(d). In the next step, the diamond layer 3 is patterned and portions are selectively removed to define a pattern of scribe lines or streets 6. This step is shown in FIG. 3(e). The diamond layer in the streets 6 is removed as discussed above by a suitable high energy electromagnetic beam including a laser beam or a reactive ion etch or ion beam etch. As an alternative, the sacrificial substrate as shown in FIG. 3(b) may be removed as shown in FIG. 3(c.1), resulting in a freestanding diamond film with polysilicon layer 22. Then the handle is placed upon the polysilicon layer 22 as shown in FIG. 3(d.1). The diamond layer 3 may be suitably patterned as shown in FIG. 3e. Further details are taught in SE-911, Ser. No. 29,860, filed Mar. 11, 1993, assigned to the same assignee as this application and incorporated herein by reference.

Figure 3F:
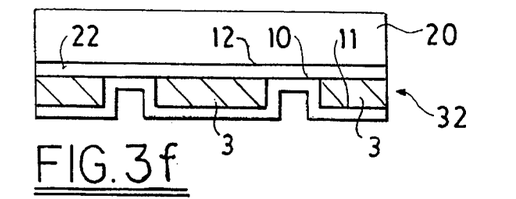

In order to bond a device wafer 4 to the diamond layer 3, a second polysilicon layer 32 of about 500 angstroms is deposited on the surface 11 of the diamond layer 3 and the exposed portions of lower polysilicon layer 22. The layer 32 may also comprise silicon nitride. If silicon nitride is used, it is deposited on surface 11 before the second polysilicon layer. Its thickness may be 300 to 500 angstroms. See FIG. 3(f). SE-911, Ser. No. 29,860, filed Mar. 11, 1993, assigned to the same assignee as this application and incorporated herein by reference teaches the utility of a thin nitride layer as an oxidation and diffusion barrier.

Figure 3G:
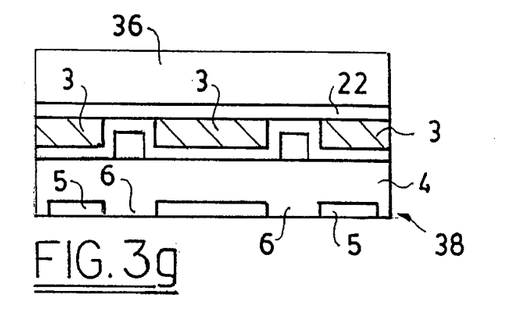
Figure 3H:
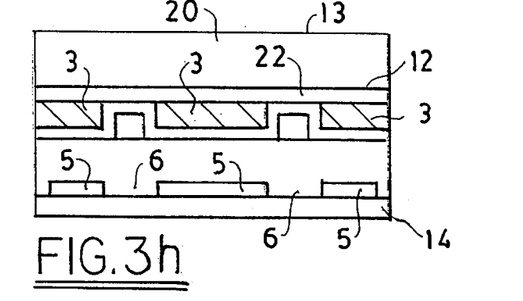
Figure 3H:
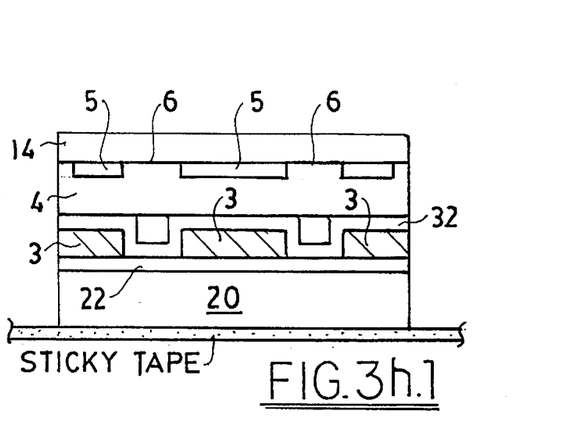

In the next step as shown in FIG. 3g, a device wafer 4 is bonded to the second polysilicon layer 32. It will be noted that the scribe lines 6 appear as a series of patterned voids between the handle 20 and the device layer 4. The device wafer 4 is suitably processed to form microelectronic circuits 5 on the upper surface 38 thereof. The microelectronic circuits 5 are covered with die passivation layer 14, FIG. 3h, consisting of, for example, silicon nitride or silicon oxynitride. The microelectronic circuits 5 will be separated by areas of silicon that comprise scribe lines 6. It is understood that the scribe lines 6 comprise a pattern that corresponds to the pattern of the voids 36. As such, the handle 20 may be removed and the dies 5 may be separated by sawing through the scribe line 6 and voids 36.

Figure 3I:
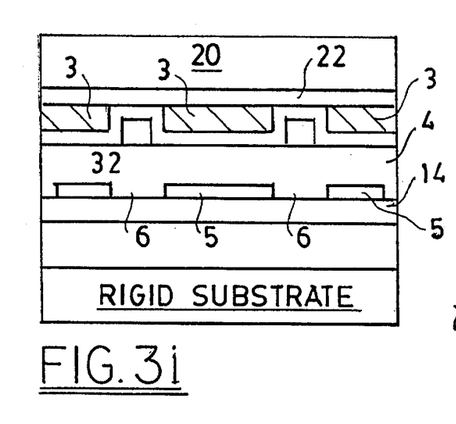
Figure 3J:
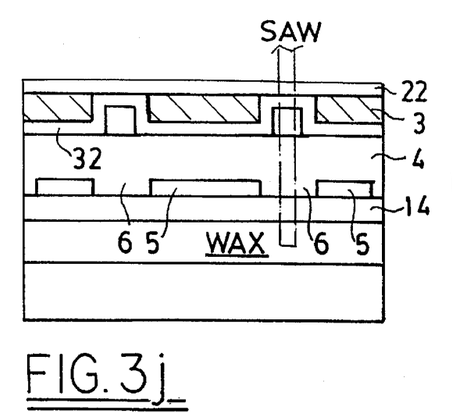
Figure 3J:
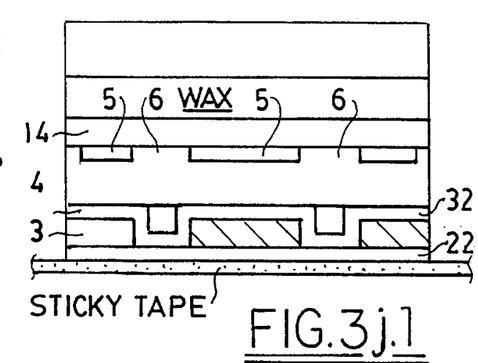
Figure 3K:
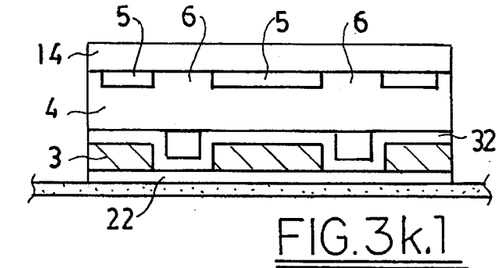

Prior to die separation, the device layer 4 containing microelectronic circuits 5, covered by passivation layer 14, may be mounted with wax onto a rigid substrate, FIG. 3i. The handle 20 may then be removed using a wet etch of potassium hydroxide or nitric acid/HF which will stop at the bonded oxide or silicide surface of layer 22. An oxide surface is then removed with HF acid; a silicide surface is removed with a wet etch of HCl:HNO, in 1:1 proportions. That will expose the polysilicon layer 22. At this point the die may be separated by sawing through the scribe lines 6 and removing individual die from the rigid substrate, FIG. 3j. Alternatively, the exposed polysilicon layer 22 may be attached to sticky tape, FIG. 3j.1, and the rigid substrate removed by heating the wax, FIG. 3k.1. At this point die separation can be accomplished by either sawing the scribe lines 6 from the device side or flexure of the sticky tape which causes cleavage along the scribe lines 6. An alternative die separation could proceed from FIG. 3h. The handle 20 may be attached to sticky tape and the wafer sawn along scribe lines 6, through handle 20, FIG. 3h.1. The separated dies 5 would retain their handle portions.

Figure 4A:
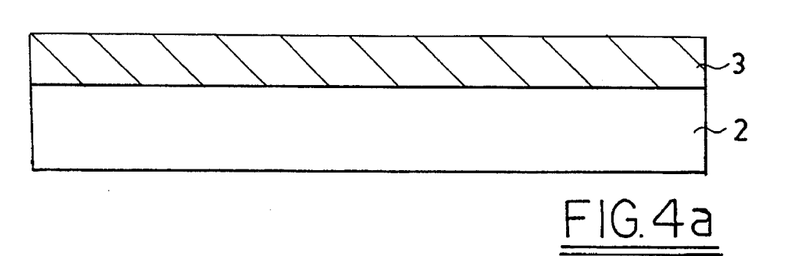
FIGS. 4a–g are a series of partial schematic views illustrating diamond removal and scribing before joining a device wafer to a diamond film.
Figure 4B:
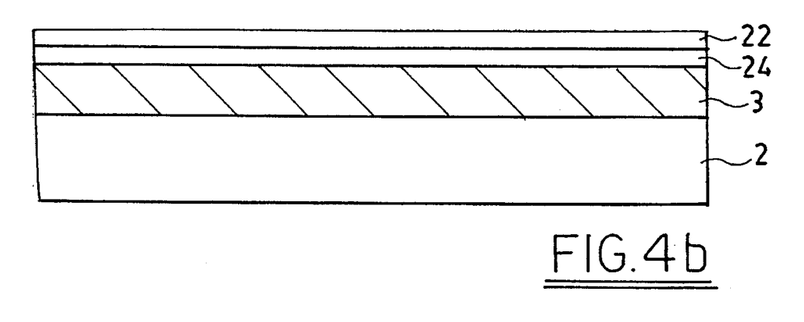
Figure 4C:
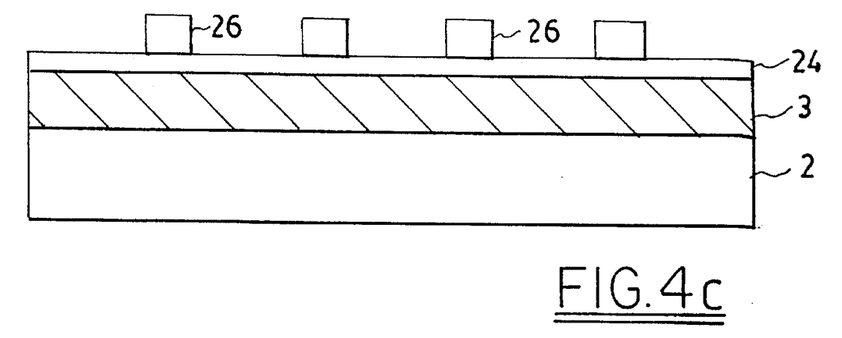
Figure 4D:
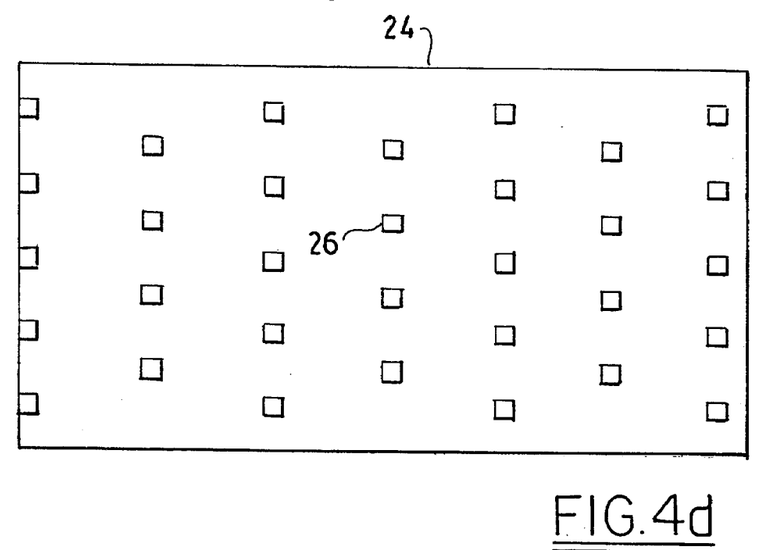
Figure 4E:
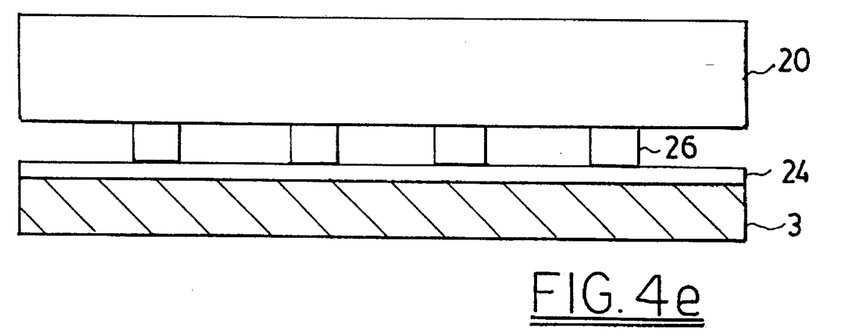
Figure 4F:
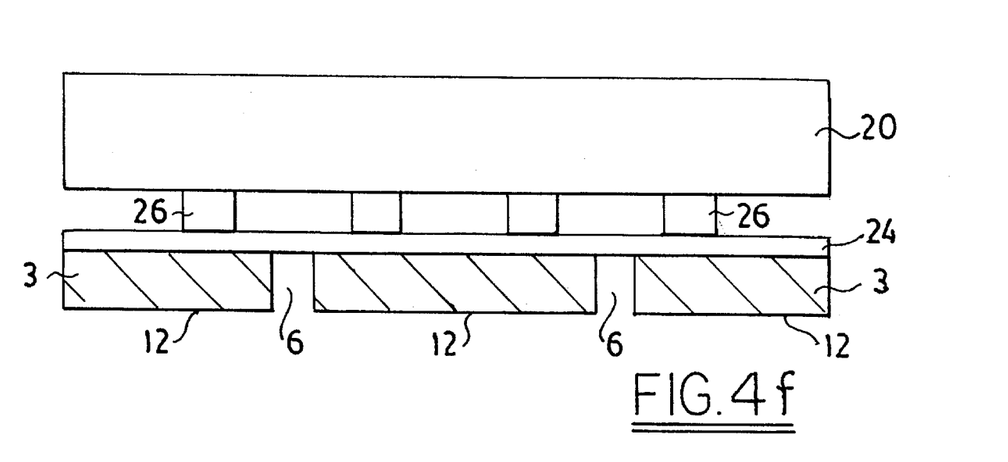

Alternate manufacturing processes may also use the invention. For example with reference to FIGS. 4a–g there is shown another embodiment. As shown in FIG. 4(a), a diamond layer 3 is formed over a sacrificial substrate 2. The diamond layer 3 is coated with a silicon nitride layer 24 of thickness between 300 and 500 angstroms and a polysilicon layer 22 of thickness about 1000 to 2000 angstroms (see FIG. 4(b)). The polysilicon layer 22 is patterned and completely reacted with oxygen to form a matrix pattern of silicon dioxide patterns 26. See FIG. 4(e). As shown in FIG. 4(d), a plan view, the silicon dioxide patterns 26 are randomly patterned in a dot matrix on the surface of silicon nitride layer 24 independent of the scribe lines 6. No alignment of the silicone dioxide pattern 26 is required with the scribe lines 6. The silicon dioxide pattern 26 is patterned to be 2 to 5 microns in lateral size and spaced 10 to 100 microns apart. Next, as shown in FIG. 4(e), a handle substrate 20 is bonded to the silicon dioxide patterns 26 and the sacrificial substrate 2 is removed. The scribe lines 6 are formed in the diamond layer 3 by either laser beam ablation or reactive ion etching, but are independent of the alignment of the silicon dioxide pattern 26 (see FIG. 4(f)).

Figure 4G:
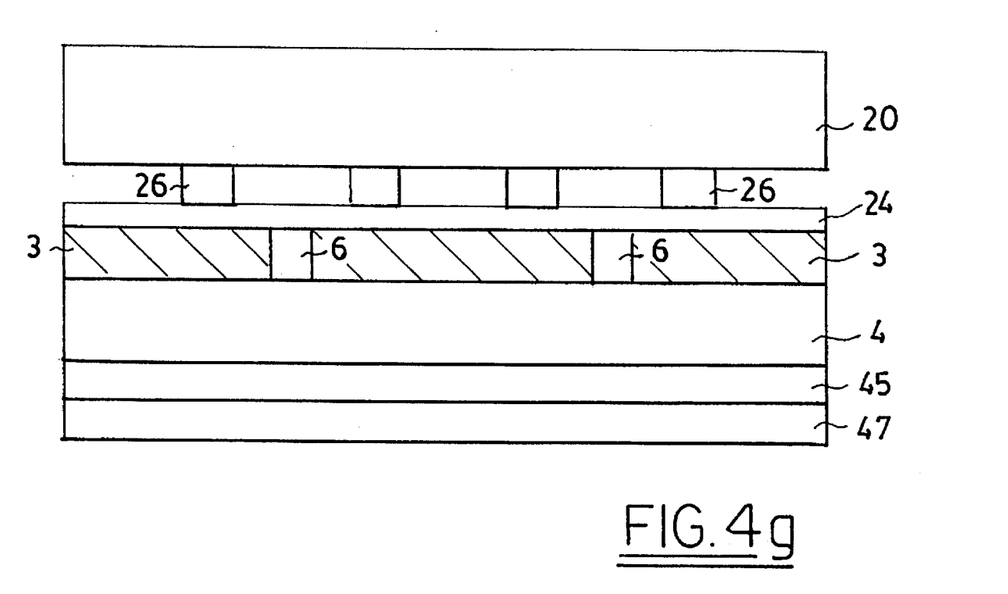

A device wafer may be attached to the surface 12 of the diamond layer 3. Microelectronic circuits are subsequently formed in a layer or layers of the device wafer. Prior to die separation, the device layer or layers containing the microelectronic circuits are mounted in wax 45 onto a rigid substrate 47, FIG. 4(g). The silicone dioxide pattern 26 is completely removed by wet etch with HF, releasing the handle substrate 20 and exposing silicon nitride layer 24. The microelectronic circuits of the device wafer can then be separated by a diamond saw that removes silicon from the device wafer by sawing through the diamond scribe lines 6 visible through silicon nitride layer 24.

Figure 5A:
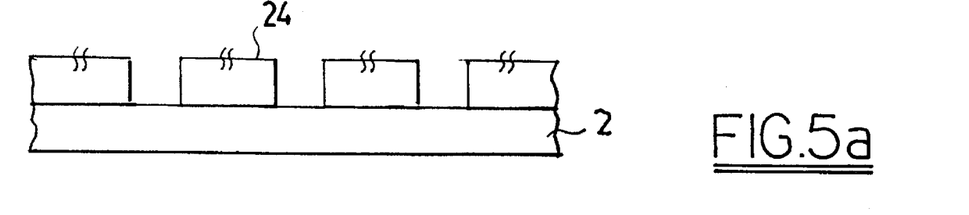
FIGS. 5a–e are a series of partial schematic views illustrating patterning a diamond film prior to joining the patterned film to a device wafer.
Figure 5B:
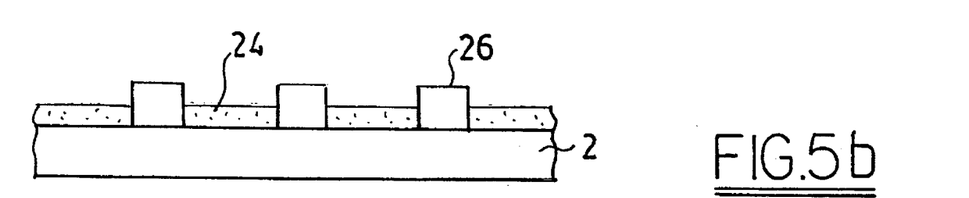
Figure 5C:
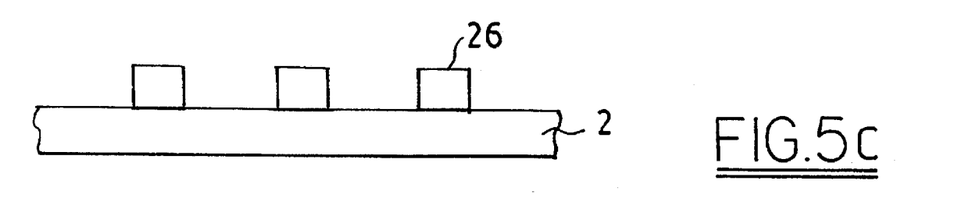
Figure 5D:
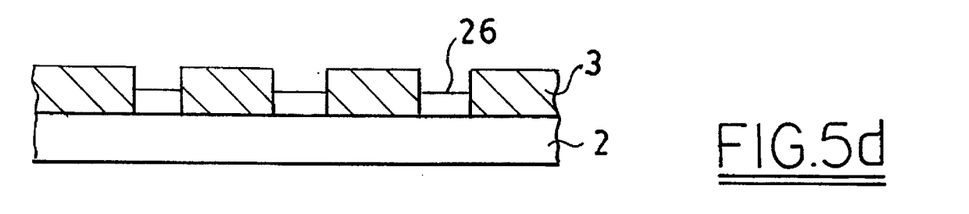
Figure 5E:
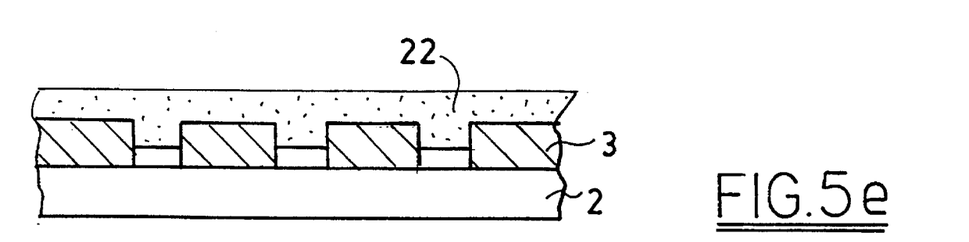

Another embodiment of the invention using selective diamond deposition is illustrated in FIGS. 5a–e. Details for selective deposition of diamond films is described in J. of Electronic Materials, Vol 18, No. 6, 1989, pages 711–715, J. L. Davidson et. al. In FIG. 5a a sacrificial silicon substrate 2 is first coated and patterned to have a silicon nitride mask 24 deposited thereon. In the spaces between the silicon nitride portions 26, a silicon dioxide pattern of lines 26 is grown. See FIG. 5(b). Silicon nitride is removed as shown in FIG. 5(c) leaving a silicon dioxide pattern 26 on the surface of the sacrificial silicon substrate 2. Using a chemical vapor deposition process, diamond material 3 is deposited onto the sacrificial wafer 2 but not onto the silicon dioxide pattern 26. See FIG. 5(d). The unevenness of the two patterns is reconciled by depositing a polycrystalline layer 22 on top of the diamond 3 and silicon dioxide 26 and thereafter planarizing the polysilicon layer 22. See FIG. 5(e). Thus, with the above described method the diamond layer portions 3 are separated by silicon dioxide portions 26. So long as the silicon dioxide portions 26 are patterned in a pattern corresponding to scribe lines, then the device wafer (not shown) may be affixed to the polysilicon layer 22 by bonding methods previously described and further processed to form microelectronic circuits. During further processing, the scribe lines on the device wafer will be aligned with the scribe lines 6 in the diamond layer 3.

It should be understood that although the disclosed embodiments have been directed to silicon on diamond, the methods are also applicable to other semiconductors suitable for microelectronic circuits, such as GaAs, InP, or combinations of the above. Those skilled in the art will further understand that the invention can be used at different times in the process of fabricating a microelectronic device. When the invention is used will depend upon the process selected and the thickness of the active layers and the diamond layer. For example, high speed CMOS processes used very thin active layers. As such, one may choose to wait until after the complete formation of the CMOS devices to use the invention. The embodiment of FIG. 1a–c and FIG. 1a.1–e.1 are especially suited for such devices. On the other hand, high power bipolar devices have relatively thick active layers. For such devices it is more desireable to use the embodiments of the invention that scribe the diamond layer before formation of the final devices. The embodiments of FIGS. 2–5 are more suitable for devices with thick active layers. The selection of the embodiment will also depend upon the desired thickness of the diamond layer. So, the embodiment shown is FIGS. 3c.1 and d.1 are especially useful for thick diamond film capable of providing a free standing diamond film. For free standing diamond layers of 200 microns or greater, the embodiment of FIG. 3c.1 and d.1 is preferred.

The foregoing has disclosed several embodiments of the invention. One of the technical advantages of the disclosed embodiments is that they provide practical techniques for separating silicon on diamond circuit dies. These techniques are compatible and integratable with existing manufacturing processes and assembly techniques including wafer dicing saws. Those skilled in the art will appreciate that various modifications, changes, additions and alterations may be made to the above embodiments without departing from the spirit and scope of the invention as defined by the following claims.

What we claim is:

1. A method for forming separate dies from a substrate having a layer of semiconductive material and a diamond layer, on a support layer comprising the steps of:

selectively removing portions of the semiconductive layer to expose portions of the diamond layer and define scribe lines in said semiconductive layer; and removing diamond from said exposed diamond areas in said scribe lines.

2. The method of claim 1 further comprising the step of sawing the support layer along said scribe lines to separate said dies from each other.

3. The method of claim 1 wherein the step of selectively removing portions of the semiconductive layer is performed by an etching step comprising reactive ion etching.

4. The method of claim 1 wherein the step of selectively removing portions of the semiconductor layer is performed by exposing the semiconductive layer to a KrF excimer laser.

5. The method of claim 1 wherein the diamond is removed by a laser beam.

6. The method of claim 5 wherein the laser beam is generated by laser selected from a group consisting of a frequency doubled Nd:Yag laser and an ArF laser.

7. The method of claim 5 wherein the scribe line has a kerf greater than the kerf of diamond removed by the beam.

8. The method of claim 1 wherein the semiconductive layer is masked and etched to define scribe lines therein.

9. The method of claim 8 wherein the etching is reactive ion etching.

10. The method of claim 1 wherein the exposed diamond layer is removed by reactive ion etching in the presence of oxygen.

11. The method of claim 1 wherein the exposed diamond layer is removed by ion beam etching.

12. A method for separating a diamond layer on a support layer into die comprising the steps of:

selectively removing diamond material from said diamond layer to form scribe lines in said diamond layer;

attaching a substrate of semiconductor material to said diamond layer;

sawing said semiconductor substrate along the scribe lines of the diamond layer in order to separate the substrate into die.

13. The method of claim 12 further comprising the steps of:

attaching a device wafer to the diamond layer having scribe lines;

reducing the thickness of the device wafer;

forming devices in said device wafer.

14. The method of claim 13 further comprising the steps of:

attaching the device wafer to a waxed surface of a rigid substrate;

removing the support layer;

sawing the device wafer through the scribe pattern in said diamond layer.

15. The method of claim 13 further comprising the steps of:

attaching the device wafer to a waxed surface of a rigid substrate;

removing the support layer;

mounting the rigid substrate on a flexible adhesive surface;

removing the waxed, rigid substrate;

sawing the device wafer that remains attached to the flexible adhesive surface.

16. The method of claim 12 including the step of providing a first support layer and depositing the diamond layer on the support layer.

17. The method of claim 16 wherein the step of selectively removing said diamond layer is performed after the step of depositing the diamond layer on the first support layer.

18. The method of claim 12 wherein the diamond layer is selectively removed by a laser beam.

19. The method of claim 12 wherein the laser beam is generated by a laser selected from a group consisting of a frequency doubled Nd:Yag laser and an ArF laser.

20. The method of claim 12 wherein the exposed diamond layer is removed by reactive ion etching in the presence of oxygen.

21. The method of claim 12 wherein the exposed diamond layer is removed by ion beam etching.

22. The method of claim 12 further comprising the step of attaching the diamond layer to a semiconductor layer and removing the first support layer.

23. The method of claim 18 wherein the semiconductor layer is attached to the diamond layer after the beam is applied to the diamond layer.

24. A method for forming and separating dies on a support substrate comprising the steps of;

depositing a first masking layer on support substrate;

selective removing portions of the first masking layer to define scribe lines of exposed areas of the surface of the support substrate;

forming a first layer of insulating material in said scribe lines;

removing the remaining portions of the first masking layer to expose portions of the substrate not covered by the insulating material;

depositing diamond material on the exposed portions of the substrate;

depositing a first bonding layer; and attaching a semiconductor substrate to the bonding layer.

25. The method of claim 24 wherein the support substrate is silicon.

26. The method of claim 25 wherein the first masking layer is silicon nitride and the insulating layer is silicon dioxide.

27. The method of claim 24 wherein the bonding layer is polysilicon.

28. The method of claim 26 wherein the silicon dioxide layer is removed after the diamond layer is deposited.

29. The method of claim 24 further comprising the step of forming electrical circuits in said semiconductor substrate.

30. The method of claim 24 further comprising the step of removing the support substrate.

31. The method of claim 24 further comprising the step of sawing the semiconductor substrate along the scribe lines defined by the insulating material.

32. A method for separating a substrate into dies comprising:

providing a support layer having a layer of diamond material;

patterning the layer of diamond material, said pattern defining a plurality of scribe lines;

attaching a semiconductor substrate to said patterned layer; and forming a plurality of electrical circuits as dies on said semiconductor substrate in a pattern corresponding to the pattern of the scribe lines;

sawing the semiconductor substrate along said scribe lines into separate dies.

33. The method of claim 32 wherein the pattern of scribe lines on the support layer is formed by exposing the diamond layer to a beam that removes said diamond material.

34. The method of claim 33 wherein the beam is a laser beam.

35. The method of claim 34 wherein the laser beam is generated by a laser selected from the group consisting of a Nd:Yag laser and an ArF laser.

36. The method of claim 32 wherein the pattern of scribe lines is formed by masking the support layer with a diamond resistive material and patterning said diamond resistive material into a pattern of scribe lines.

37. The method of claim 36 wherein selected portions of the diamond layer are removed by reactive ion etching in the presence of oxygen.

38. The method of claim 32 wherein selected portions of the diamond layer are removed by ion beam etching.

39. A method for forming scribe lines in a diamond layer comprising the steps of:

providing a substrate for supporting a diamond layer;

forming a layer of patterned diamond on said substrate; said pattern comprising a plurality of spaced apart areas, said areas spaced apart a distance sufficient to allow a saw blade capable of separating said substrate to pass between said spaced apart areas of diamond;

joining a device substrate to the support substrate, forming microelectronic devices in the device substrate, said devices being spaced apart a distance sufficient to allow a saw blade capable of separating said device substrate to pass between said spaced apart areas of said device.

40. The method of claim 39 wherein the step of forming a layer of patterned diamond comprises depositing a diamond resist material on said substrate and selectively removing portions of said resist material.

41. The method of claim 40 wherein the diamond resist material is silicon dioxide and the substrate is silicon.

42. The method of claim 39 further comprising the steps of providing a substrate of silicon;

depositing a layer of silicon nitride;

masking the layer of silicon nitride and removing selected, unmasked portions of silicon nitride to leave a mask of silicon nitride corresponding to the desired diamond pattern with the remaining areas of silicon nitride space apart the distance to allow a saw blade to pass between the remaining areas of silicon nitride.

43. The method claim of claim 42 further comprising the step of providing silicon dioxide in said spaced apart areas, removing the silicon nitride, and depositing diamond on the areas removed of silicon nitride.

44. The method of claim 43 wherein the steps of joining a device substrate to the support substrate and forming microelectronic devices in the device substrate are performed after the step of forming a patterned diamond layer.

45. The method of claim 39 wherein the step of providing a patterned diamond layer comprises depositing a layer of diamond and selectively removing portions of the diamond layer to provide a plurality of spaced apart areas of diamond, said spacing being a predetermined distance sufficient to allow a saw blade to pass between said spaced apart areas of diamond.

46. The method of claim 45 further comprising the step of providing a bonding layer on said support substrate for bonding said support substrate to another substrate.

47. The method of claim 46 wherein the bonding layer comprises a layer of silicon dioxide.

48. The method of claim 47 further comprising the steps of joining a device substrate to the support substrate, forming microelectronic devices in the device substrate, said devices being spaced apart a distance sufficient to allow a saw blade capable of separating said device substrate to pass between said spaced apart areas of said device wafer and said diamond layer.

49. A method comprising the steps of:

providing a sacrificial substrate having a diamond layer and a patterned bonding layer:

bonding the patterned bonding layer to a handle substrate;

selectively removing portions of the diamond layer to provide a scribe pattern in said layer.

50. The method of claim 49 wherein the pattern of the bonding layer is independent of the pattern of the scribed diamond layer.

51. The method of claim 49 wherein the bonding layer comprises a random pattern of pillars of silicon dioxide.

52. The method of claim 49 further comprising the step of providing an intermediate layer between the diamond layer and the bonding layer.

53. The method of claim 52 wherein the intermediate layer is silicon nitride.

54. The method of claim 49 further comprising bonding a device wafer to the patterned diamond layer.

55. The method of claim 54 further comprising separating the device wafer by scribing a pattern in the device wafer corresponding to the pattern of the diamond layer.

56. The method of claim 49 wherein portions of the diamond are selectively removed with a laser beam.

57. The method of claim 49 wherein portions of the diamond layer are selectively removed by ion beam etching.

58. The method of claim 49 wherein portions of the diamond layer are selectively removed by reactive ion etching in the presence of oxygen.

59. The method of claim 54 further comprising the step of forming devices in said device wafer.

60. The method of claim 59 further comprising the step of dissolving the bonding layer.

61. The method of claim 60 further comprising the step of removing the handle substrate.

62. A method of fabricating semiconductor on insulator structures suitable for electronic device formation comprising the steps of:

providing a support substrate;

depositing a layer of diamond over the support substrate;

selectively removing portions of diamond layer to form scribe lines;

forming plurality of discrete diamond containing regions isolated from one another on the support substrate;

depositing a bonding layer over said regions for joining a device layer to said regions; and bonding a device layer to said regions.

63. The method of claim 62 wherein the support layer is silicon.

64. The method of claim 62 wherein the bonding layer comprises silicon dioxide.

65. The method of claim 64 wherein the silicon dioxide layer comprises random pillars of silicon dioxide.

66. The method of claim 62 wherein the bonding layer comprises random pillars.

67. The method of claim 62 comprising the step of forming an intermediate layer between the diamond regions and the bonding layer.

68. The method of claim 67 wherein the intermediate layer comprises silicon nitride.

69. The method of claim 62 further comprising the step of scribing the device wafer in a pattern corresponding to the discrete diamond containing regions.

70. The method of claim 1 wherein the diamond is selectively removed by a laser beam.

71. The method of claim 62 wherein the diamond is selectively removed by ion beam etching.

72. The method of claim 62 wherein the diamond is selectively removed by reactive ion etching in the presence of oxygen.

73. The method of claim 62 further comprising forming devices in said device layer.

74. The method of claim 73 further comprising the step of dissolving the bonding layer.

75. The method of claim 74 further comprising the step of removing the support substrate.

* * * * *